United States Patent [19]

Suzuki et al.

[11] 4,301,427
[45] Nov. 17, 1981

[54] ASTABLE MOS FET MULTIVIBRATOR

[75] Inventors: Yasoji Suzuki, Ayase; Tetsuya Iida, Yokohama, both of Japan

[73] Assignee: Tokyo Shibaura Denki Kabushiki Kaisha, Tokyo, Japan

[21] Appl. No.: 129,737

[22] Filed: Mar. 12, 1980

Related U.S. Application Data

[62] Division of Ser. No. 928,951, Jul. 28, 1978, abandoned.

[30] Foreign Application Priority Data

| Jul. 30, 1977 | [JP] | Japan | 52-91606 |
| Feb. 13, 1978 | [JP] | Japan | 53-15237 |
| Feb. 13, 1978 | [JP] | Japan | 53-15239 |

[51] Int. Cl.³ .................................................. H03K 3/354
[52] U.S. Cl. .................................... 331/111; 331/143
[58] Field of Search ............ 331/111, 113 R, 108 D, 331/143, 144

[56] References Cited

U.S. PATENT DOCUMENTS

| T955,006 | 2/1977 | Cavaliere et al. | 307/205 X |
| 3,356,858 | 12/1967 | Wanlass | 307/205 |
| 3,737,673 | 6/1973 | Suzuki | 307/205 |
| 3,775,693 | 11/1973 | Proebsting | 307/205 |
| 3,778,782 | 12/1973 | Kitagawa | 307/205 X |
| 3,904,888 | 9/1975 | Griffin et al. | 307/288 X |
| 4,023,122 | 5/1977 | Oura | 331/111 |
| 4,115,748 | 9/1978 | Kubo et al. | 331/111 |
| 4,146,849 | 3/1979 | Satou | 331/111 |

FOREIGN PATENT DOCUMENTS

| 49-115459 | 11/1974 | Japan. |
| 49-123256 | 11/1974 | Japan. |
| 50-3555 | 1/1975 | Japan. |

OTHER PUBLICATIONS

McMos Handbook, Motorola Inc., pp. 8-22 to 8-29.
RCA Catalog, "Products CD4093B", pp. 586-588.
Motorola Catalog, "Products MC14093B", pp. 5-152 to 5-154.
Motorola Catalog, "Products MC14584B", pp. 5-489 to 5-491.

*Primary Examiner*—Siegfried H. Grimm
*Attorney, Agent, or Firm*—Finnegan, Henderson, Farabow, Garrett & Dunner

[57] ABSTRACT

A Schmitt trigger astable multivibrator circuit includes a first inverter, a second inverter whose input terminal is connected to the output terminal of the first inverter, a third inverter which is constituted by a first P-channel transistor and a first N-channel transistor serially connected and whose input and output terminals are respectively connected to the output and input terminals of the second inverter. The Schmitt trigger astable multivibrator circuit further includes a second P-channel transistor connected between a positive power supply terminal and the first P-channel transistor, and a second N-channel transistor connected between a ground terminal and the first N-channel transistor, and an input signal supplied to the first inverter is also applied to the gates of the second P-channel and N-channel transistors. The astable multivibrator also includes a time constant circuit, activated in response to the second inverter's output, which connects to the first inverter's input.

11 Claims, 15 Drawing Figures

F I G. 15
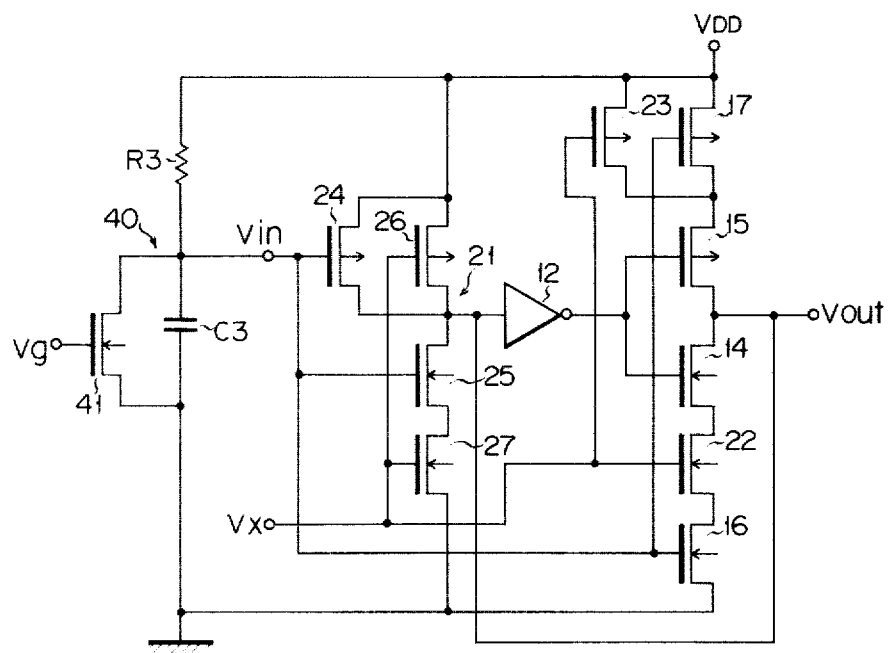

ASTABLE MOS FET MULTIVIBRATOR

This is a division of application Ser. No. 928,951, filed July 28, 1978 now abandoned.

BACKGROUND OF THE INVENTION

This invention relates to a Schmitt trigger astable MOS FET multivibrator circuit.

When an amplifier is constructed by serially connecting an even number of CMOS FET type inverters with the output terminal of the last stage inverter connected to the input terminal of the first stage inverter, and the input voltage varies at a level close to the threshold voltage of the inverter, the output signal changes between the logic levels "0" and "1". This effect can be particularly troublesome for astable multivibrators. To suppress such erroneous behavior caused by noise, it is considered necessary to give the above-mentioned amplifier a hysteresis characteristic, thereby changing the logic level of inverted threshold voltage in a case where the input voltage has its logic level varied from high to low or vice versa.

FIG. 1 shows an input-output characteristic of the above-mentioned amplifier to illustrate the hysteresis characteristic thereof. $V_{in}$ denotes an input voltage, and $V_{out}$ shows an output voltage. $V_{THH}$ indicates the threshold voltage of the amplifier where the input voltage $V_{in}$ has its logic level changed from "0" to "1". $V_{THL}$ represents the trheshold voltage of the amplifier where the input voltage $V_{in}$ has its logic level changed from "1" to "0". The larger the difference between these threshold voltages $V_{THH}$ and $V_{THL}$, the smaller the effect of noises included in the input voltage $V_{in}$. An amplifier having the above-mentioned hysteresis characteristic is referred to as "a Schmitt trigger circuit."

FIG. 2 shows an arrangement of a prior art Schmitt trigger circuit which includes three series-connected inverters 1, 2, 3 and P-and N-channel MOS FETs 4 and 5 connected in parallel between the output terminals of the first and third inverters 1 and 3. An input signal supplied to the inverter 1 is also applied to the gates of MOS FETs 4 and 5.

There will now be described the case where the input voltage $V_{in}$ is increased from a logic level of "0" to that of "1". When the input voltage $V_{in}$ rises slightly higher than the threshold voltage $V_{THH}$, then an output voltage $V_1$ from the inverter 1 falls slightly from the threshold voltage $V_{THL}$ of the inverter 2. This voltage change is amplified by the inverters 2 and 3. Accordingly, an output voltage $V_{out}$ from the amplifier gets slightly lower than the output voltage $V_1$ from the inverter 1. At this time, considerably high back gate bias voltage is impressed on the MOS FETs 4 and 5, which appreciably increase their effective resistance in response. Consequently, the N-channel MOS FET 4 is not rendered operative, unless the output voltage $V_{out}$ from the amplifier falls considerably. Accordingly, a decline occurs in the voltage of a signal fed back from the output terminal of the inverter 3 to the input terminal of the inverter 2, causing the output voltage $V_1$ from the inverter 1 to make a very gentle fall.

Where the input voltage $V_{in}$ has its logic level changed from "1" to "0", then the output voltage $V_1$ from the inverter 1 rises very slowly. It is seen, therefore, that the prior art Schmitt trigger circuit of FIG. 2 has a speed limitations, which, if used in an astable multivibrator, would limit the upper frequency of the multivibrator.

SUMMARY OF THE INVENTION

It is accordingly the object of this invention to provide a Schmitt trigger astable multivibrators circuit which is free from the effect of back gate bias voltage and can be operated at a high speed.

According to an aspect of this invention, there is provided an astable multivibrator circuit which comprises first and second power supply terminals; a second inverter whose input terminal is connected to the output terminal of the first inverter; a third inverter including an inverter section formed of a MOS circuit whose input and output terminals are respectively connected to the output and input terminals of the second inverter, and MOS elements which are connected to both terminals of the conduction path of the MOS between the first and second power supply terminals and whose gates are jointly connected to the input terminal of the first inverter; a time constant circuit for supplying a signal to the input of the first inverter; and switching means for activating the time constant circuit in response to an ouptut signal from the second inverter and for permitting a signal having a prescribed frequency to be produced from the time constant circuit to the first inverter.

BRIEF DESCRIPTION OF THE DRAWINGS

FIG. 15 shows the arrangement of a monostable multivibrator according to a still further embodiment of the invention.

DETAILED DESCRIPTION OF THE PREFERRED EMBODIMENTS

There will now be described a Schmitt trigger astable multivibrator circuit embodying this invention by reference to the accompanying drawings.

Figure 1:
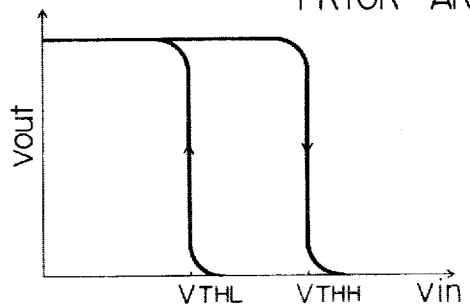
FIG. 1 shows the input-output characteristic of the prior art Schmitt trigger circuit.
Figure 2:
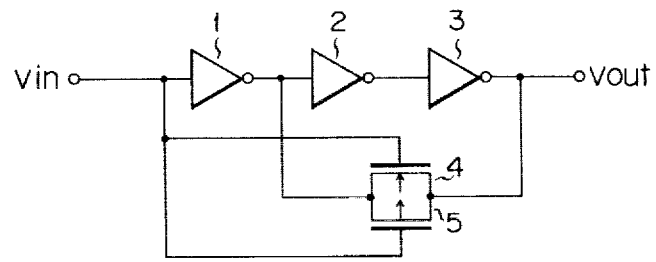
FIG. 2 indicates the arrangement of the prior art Schmitt trigger circuit.
Figure 3:
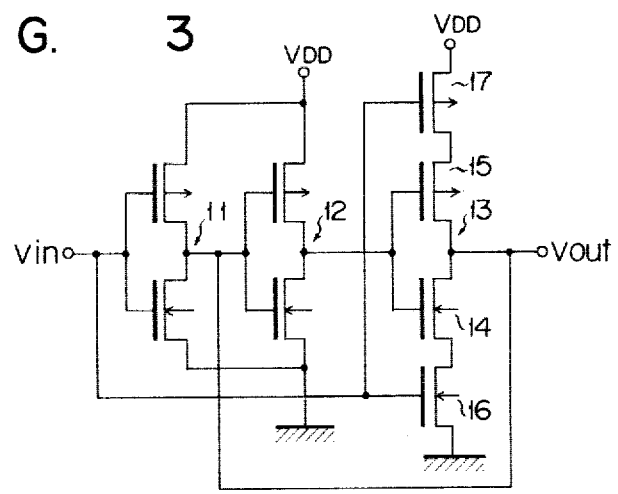
FIG. 3 sets forth the arrangement of a Schmitt trigger circuit according to one embodiment of this invention.

A Schmitt trigger circuit of FIG. 3 embodying this invention includes an inverter 11 formed of, for example, a CMOS FET element and supplied with input voltage $V_{in}$, an inverter 12 for inverting an output signal from the inverter 11, and an inverter 13 for inverting an output signal from the inverter 12 and feeding the resultant output signal back to the input terminal of the inverter 12.

The inverter 13 includes N- and P-channel MOS FETs 14 and 15 whose gates are jointly connected to the output terminal of the inverter 12, an N-channel MOS FET 16 connected between the source of the N-channel MOS FET 14 and ground, and a P-channel MOS FET 17 connected between the drain of the P-channel MOS FET 15 and a power supply terminal $V_{DD}$. The MOS FETs 16 and 17 are rendered conductive or nonconductive according to the logic level of input terminal $V_{in}$ supplied to the gates thereof. Output voltage $V_{out}$ from the Schmitt trigger circuit of FIG. 3 is drawn out of the output terminal of the inverter 13.

There will now be described the case where input voltage $V_{in}$ supplied to the Schmitt trigger circuit of FIG. 3 has its logic level changed from "0" to "1". At this time, the N-channel MOS FET of the inverter 11 is biased to be rendered conductive, and gradually decreases in effective resistance. The MOS FET 16 of the inverter 13 is biased for conductive state and the MOS FET 17 thereof is biased to nonconductive state.

While the input voltage $V_{in}$ does not exceed the threshold voltage $V_{THH}$ of the Schmitt trigger circuit, the inverter 12 generates an output voltage having a logic level of "0". Therefore, the MOS FET 15 is kept conductive and the MOS FET 14 remains nonconductive.

Output voltage from the inverter 13, that is, output voltage $V_{out}$ from the Schmitt trigger circuit is kept at a $V_{DD}$ level or a logic level of "1". When the input voltage $V_{in}$ reaches the threshold voltage $V_{THH}$, then the N-channel MOS FET of the inverter 11 is rendered conductive.

At this time, output voltage $V_1$ from the inverter 11 which is defined by a ratio between the effective resistance of the N-channel MOS FET and the effective resistance of the series connected MOS FETs 15 and 17 of the inverter 13 becomes equal to the threshold voltage of the inverter 12. As the result, the logic level of output voltage from the inverter 12 is changed from "0" to "1", causing the MOS FET 14 to be rendered conductive and the MOS FET 15 to be rendered nonconductive. Since, at this time, the MOS FET 16 is already rendered conductive, no appreciable difference arises between the source potential of the MOS FET 14 and the substrate potential. Therefore, the MOS FET 14 is little impressed with back gate bias voltage, and output voltage from the inverter 13 sharply falls.

Since, output voltage from the inverter 13 is directly impressed on the input terminal of the inverter 12, output voltage from this inverter 12 rapidly rises, and output voltage from the inverter 13 sharply falls. Also, where the input voltage $V_{in}$ falls from a logic level of "1" to "0", the inverters 11, 12 and 13 operate substantially in the same manner as described above, causing output voltage from the Schmitt trigger circuit of FIG. 3 to fall sharply.

In the Schmitt trigger circuit of FIG. 3 when, the mutual conductance of the MOS FETs 14 and 16 of the inverter 13 is made larger than that of the P-channel MOS FET and the mutual conductance of the MOF FETs 15 and 16 of the inverter 13 is similarly made larger than that of the N-channel MOS FET, then it is possible to provide a wide difference between the threshold voltages $V_{THH}$ and $V_{THL}$ of the Schmitt trigger circuit of FIG. 3.

Figure 4:
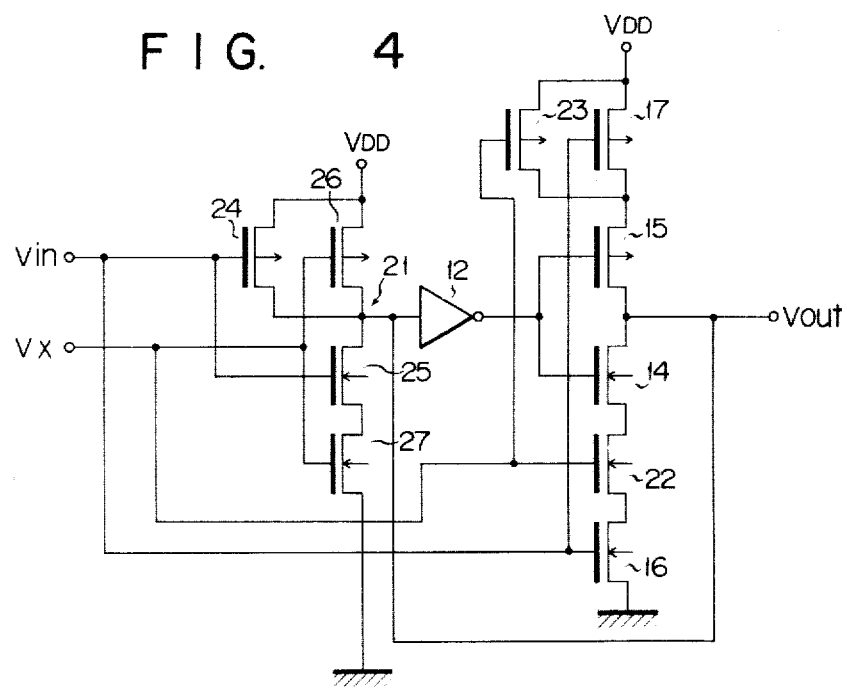
FIG. 4 shows the arrangement of a Schmitt trigger circuit according to another embodiment of the invention.

FIG. 4 shows the arrangement of a Schmitt trigger circuit according to another embodiment of this invention. This Schmitt trigger circuit is not provided with the inverter 11 but instead with a control circuit 21 for receiving an input signal $V_{in}$ and control signal $V_x$. The Schmitt trigger circuit further includes an N-channel MOS FET 22 connected between the MOS FETs 14 and 16 and a P-channel MOS FET 23 connected in parallel with the MOS FET 17. In other respects, the embodiment of FIG. 4 has substantially the same arrangement as that of FIG. 3. The conduction state of MOS FETs 22 and 23 is controlled by the logic level of a control signal $V_x$ supplied to the gates of the MOS FETs 22 and 23.

The control circuit 21 includes P-channel MOS FET 24 and N-channel MOS FET 25 whose gates are supplied with an input signal $V_{in}$ and whose conduction paths are connected in series; P-channel MOS FET 26 is connected in parallel with the MOS FET 24 and N-channel MOS FET 27 is connected between the source of the MOS FET 25 and ground. A control signal $Y_x$ is supplied to the gates of the MOS FETs 26 and 27.

In this case, it should be noted that the effective resistance of the MOS FETs 22, 23, 26, 27 gradually varies with the voltage level of the control signal $V_x$. For example, where the control signal $V_x$ is made to have the highest voltage level, then the MOS FETs 23 and 26 prominently rise in effective resistance, thus rendering the arrangement of FIG. 4 equivalent to that of FIG. 3. When the voltage of the control signal $V_x$ is reduced from the highest level, then the MOS FETs 23 and 26 decrease in effective resistance, and the MOS FETs 22 and 27 increase in effective resistance.

Where, therefore, the logic level of the input voltage $V_{in}$ changes from "0" to "1", then the output voltage from the control circuit 21, which is defined by a ratio between a sum of the effective resistance of the parallel connected MOS FETs 17 and 23 and the effective resistance of the MOS FET 15 on the one hand, and the effective resistance of the series-connected MOS FETs 25 and 27 on the other, increases over the case when the control voltage is made to have the highest level.

Conversely, where the logic level of the input voltage $V_{in}$ changes from "1" to "0", then the output voltage from the control circuit 21, which is defined by a ratio between the effective resistance of the parallel connected MOS FETs 24 and 26 and the effective resistance of the series connected MOS FETs 14, 22 and 16, decreases from the case where the control voltage is set at the highest level. Namely, the lower the control voltage $V_x$, the higher the threshold voltages $V_{THH}$ and $V_{THL}$ of the Schmitt trigger circuit of FIG. 4.

Figure 5:
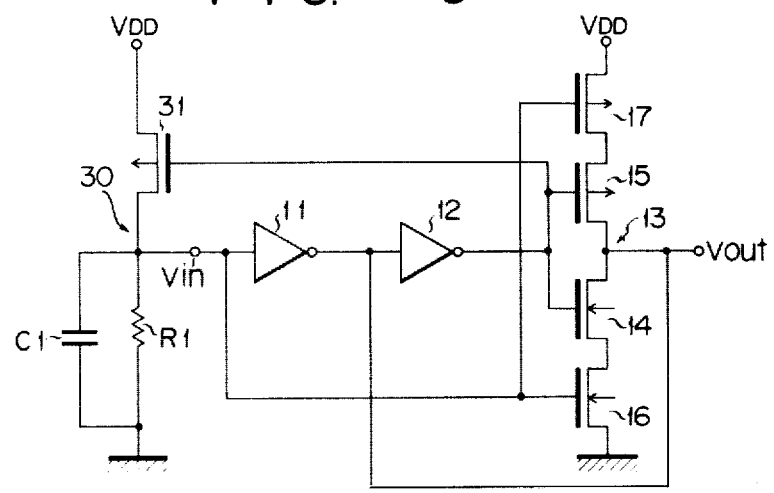
FIG. 5 presents the arrangement of an astable multivibrator according to still another embodiment of the invention.

FIG. 5 indicates the arrangement of an astable multivibrator circuit according to another embodiment of this invention, which is constructed by connecting an input circuit section 30 to the Schmitt trigger circuit of FIG. 3. This input circuit section 30 includes parallel-connected capacitor $C_1$ and resistor $R_1$ to constitute a CR time constant circuit, and a P-channel MOS FET element 31 which is connected between the power supply terminal $V_{DD}$ and the junction of the capacitor $C_1$ and the resistor $R_1$. The gate of element 31 is supplied with an output signal from the inverter 12 of the Schmitt trigger circuit section.

Figure 6:
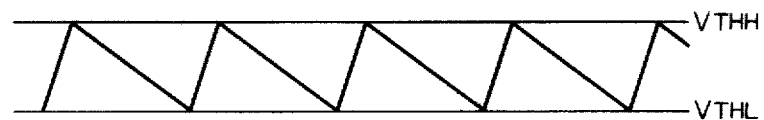
FIG. 6 illustrates the waveform of an input signal supplied to the astable multivibrator of FIG. 5.
Figure 7:
FIG. 7 indicates the waveform of an output signal from the multivibrator.

There will now be described the operation of the astable multivibrator of FIG. 5 by reference to FIG. 6 showing the waveform of a input signal $V_{in}$ supplied to the Schmitt trigger circuit section, as well as to FIG. 7, illustrating the waveform of an output signal $V_{out}$ from the Schmitt trigger circuit section.

Assume now that the logic level of the input voltage $V_{in}$ has been changed from "1" to "0". Then the MOS FET 17 is rendered conductive and the MOS FET 16 becomes nonconductive. Therefore, the inverter 12 produces an output signal having a logic level of "0", causing the MOS FET 14 to be rendered nonconductive and the MOS FETs 15 and 31 conductive. Accordingly, the output voltage $V_{out}$ from the Schmitt trigger circuit rises as illustrated in FIG. 7.

The capacitor C1 is gradually charged through the MOS FET 31 which is now rendered conductive, causing the input voltage $V_{in}$ slowly to rise as shown in FIG. 6. When the input voltage $V_{in}$ reaches the threshold voltage $V_{THH}$ of the Schmitt trigger circuit section, i.e., has a logic level of "1", then the MOS FET 16 is rendered conductive, and the MOS FET 17 is turned off.

At this time, the inverter 12 has a logic level of "1", causing the MOS FET 14 to be rendered conductive and the MOS FETs 15 and 31 to be rendered nonconductive. Output voltage $V_{out}$ from the Schmitt trigger circuit section falls to a logic level of "0", as indicated in FIG. 7. Electric energy charged in the capacitor $C_2$ is released through the resistor $R_1$, causing the input voltage $V_{in}$ to decrease slowly as seen from FIG. 6.

Where the input voltage $V_{in}$ again has its logic level changed to "0", that is, it reaches the threshold voltage $V_{THL}$ of the Schmitt trigger circuit section, then the astable multivibrator is operated in the same manner as described above, issuing pulses having a constant pulse width as illustrated in FIG. 7.

With the astable multivibrator of FIG. r, assume that the effective resistance of the MOS FET 21 when rendered conductive is denoted by $R_{ON}$, current running through the MOS FET by $I_1$, and current conducted through the resistor $R_1$ by $R_2$. When, a voltage drop $V_2$ occurring in the MOS FET 31 is expressed by the following equation:

$$V_2 = I_1 \times R_{ON} = V_{DD} - V_{in} \tag{1}$$

The input voltage $V_{in}$ is expressed by the following equation:

$$V_{in} = I_2 \times R_1 = \frac{1}{C_1} \int (I_1 - I_2) dt \tag{2}$$

Derived from the above equation (2) are the following equations:

$$V_{in} = \frac{dq2}{dt} \times R_1 \tag{3}$$

$$\frac{dV_{in}}{dt} = \frac{1}{C_1} \left( \frac{dq1}{dt} - \frac{dq2}{dt} \right) \tag{4}$$

Further assuming $t = 0$ and $V_{in} = V_{THL}$, the following equation results:

$$V_{in} = \left( \frac{R_1}{(R_{ON} + R_1)} \right) V_{DD} - \tag{5}$$

$$\left[ \left( \frac{R_1}{(R_{ON} + R_1)} \right) V_{DD} - V_{THL} \right] \times$$

$$\exp \left( -\frac{1}{C_1} \left( \frac{1}{R_{ON}} + \frac{1}{R_1} \right) t \right)$$

Assuming $R_{ON} < R_1$, the above equation (5) may be rewritten as follows:

$$V_{in} = V_{DD} - (V_{DD} - V_{THL}) \exp \left( -\frac{t}{C_1 \cdot R_{ON}} \right) \tag{6}$$

The length sof time tr and tf required for the input voltage $V_{in}$ to rise and fall are respectively indicated by the following equations:

$$tr = -C_1 \cdot R_{ON} \ln \left( \frac{(V_{DD} - V_{THH})}{(V_{DD} - V_{THL})} \right) \tag{7}$$

$$tf = -C_1 \cdot R_1 \ln \left( \frac{V_{THL}}{V_{THH}} \right) \tag{8}$$

The repetition rate at which the output signal $V_{out}$ is repeatedly generated, namely, the oscillation frequency f of the astable multivibrator of FIG. 5 is expressed by the following equation:

$$f = \frac{1}{T} = \frac{1}{(tr + tf)} \tag{9}$$

$$= \frac{-1}{\left[ C \left\{ R_{ON} \ln \frac{(V_{DD} - V_{THH})}{(V_{DD} - V_{THL})} + R_1 \ln \left( \frac{V_{THL}}{V_{THH}} \right) \right\} \right]}$$

As previously mentioned the threshold voltages $V_{THL}$ and $V_{THH}$ of the Schmitt trigger circuit section are defined by the MOS FETs constituting the Schmitt trigger circuit section. Therefore, the oscillation frequency f of the astable multivibrator can be determined by the resistor $R_1$, capacitor $C_1$ and the effective resistance of the MOS FET 31 when rendered conductive.

Figure 8:
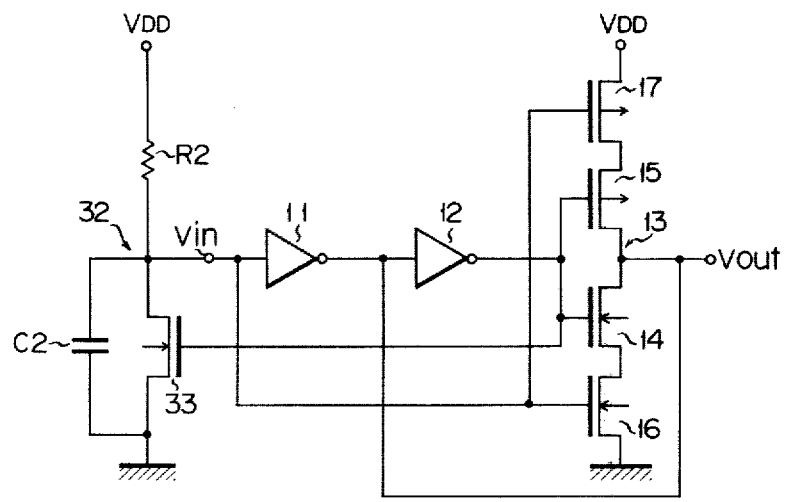
FIG. 8 is a modification of the bistable multivibrator of FIG. 5.

FIG. 8 shows a modification of the astable multivibrator of FIG. 5. This multivibrator has substantially the same arrangement as that of FIG. 5, except for an input circuit section 32 repacing the input circuit section 30 of FIG. 5. The input circuit section 32 includes a series circuit of a resistor $R_2$ and capacitor $C_2$ which jointly constitute a CR time constant circuit and are connected between the power supply terminal $V_{DD}$ and ground, and an N-channel MOS FET 33 which is connected in parallel with the capacitor $C_2$ and whose gate is supplied with an output signal from the inverter 12. The astable multivibrator of FIG. 8 is operated in the same manner as that of FIG. 5, and produces an output voltage signal which has such a waveform as illustrated in FIG. 7.

Figure 9:
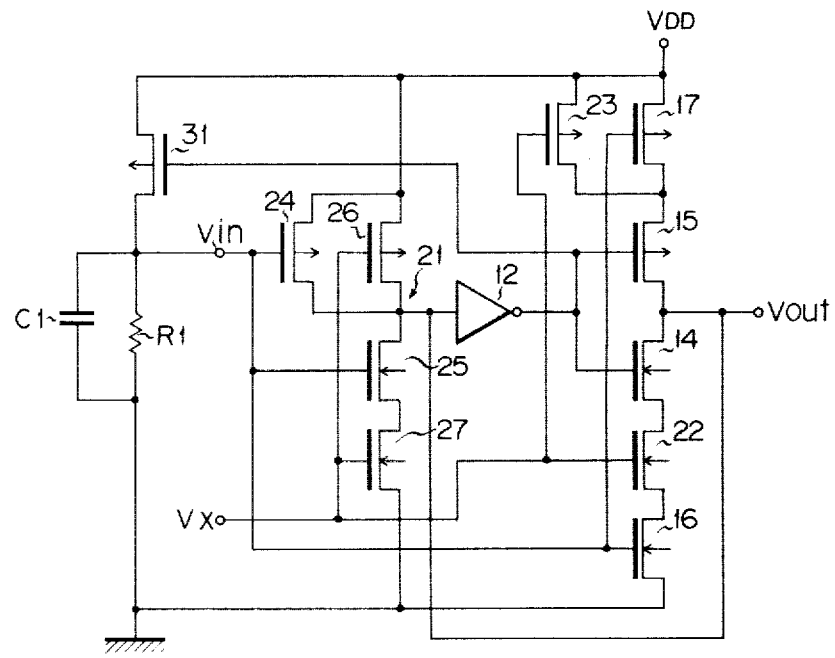
FIG. 9 sets forth the arrangement of an astable multivibrator according to still another embodiment of the invention.

FIG. 9 indicates the arrangement of an astable multivibrator according to still another embodiment of the invention, which is constructed by connecting an input circuit section 30 of the same arrangement as that used in the astable multivibrator of FIG. 5 to the input terminal of the Schmitt trigger circuit section of FIG. 4.

The astable multivibrator of FIG. 9 is operated theoretically in the same manner as that of FIG. 5. Since, as described in connection with FIG. 4, the threshold voltages $V_{THH}$ and $V_{THL}$ of the Schmitt trigger circuit section can be made to vary with the logic level of the control signal $V_x$, the oscillation frequency of the astable multivibrator of FIG. 9 can be arranged by the logic level of the control signal $V_x$.

Figure 10:
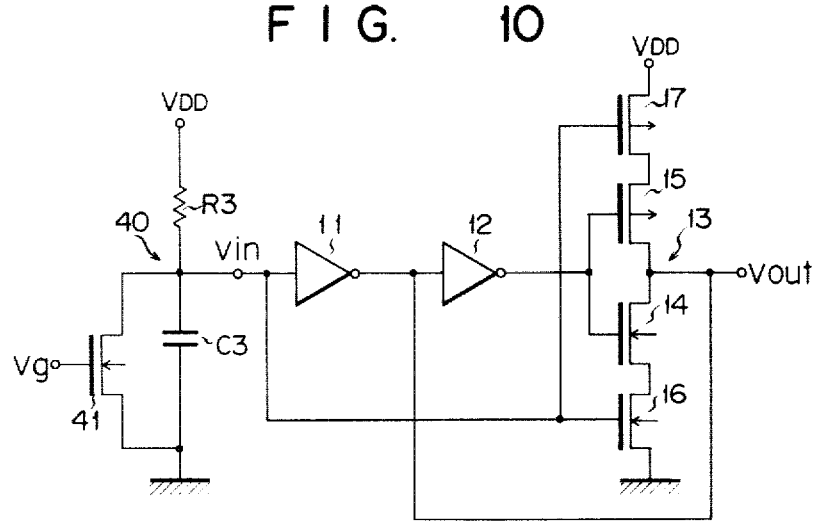
FIG. 10 indicates the arrangement of a monostable multivibrator according to a further embodiment of the invention.

FIG. 10 shows the arrangement of a monostable multivibrator according to still another embodiment of this invention, which is constructed by connecting an input circuit 40 to the input terminal of the Schmitt trigger circuit section of FIG. 3. The input circuit 40 includes a resistor $R_3$ and capacitor $R_3$ which are connected in series jointly to constitute a CR time constant circuit, and an N-channel MOS FET element 41 which is connected in parallel with the capacitor $C_3$ and whose conduction state is controlled according to the logic level of an externally supplied signal. An output signal drawn out at the junction of the capacitor $C_3$ and the resistor $R_3$ is conducted to the inverter 11.

Figure 11:
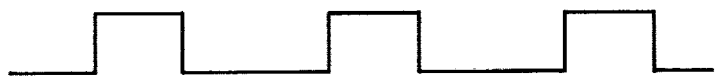
FIGS. 11 to 13 give the waveforms of signals to illustrate the operation of the monostable multivibrator of FIG. 10.
Figure 12:
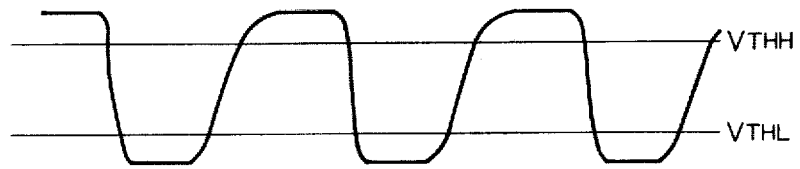
Figure 13:
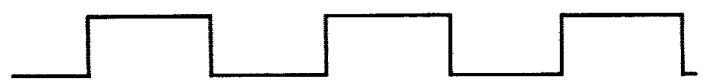

There will now be described the operation of the monostable multivibrator of FIG. 10 by reference to the waveforms of voltage signals illustrated in FIGS. 11 and 13. FIG. 11 shows the waveform of a voltage signal $V_g$ externally supplied to the gate of the MOS FET 41. FIG. 12 indicates the waveform of an input voltage signal $V_{in}$ supplied to the inverter 11. FIG. 13 sets forth the waveform of an output voltage signal $V_{out}$ from the monostable multivibrator of FIG. 10.

There will now be described the case where the gate voltage $V_g$ of the MOS FET 41 has a logic level of "0", and the MOS FET 41 remains nonconductive. Under this condition, the capacitor $C_3$ is charged up to the source voltage $V_{DD}$, causing the input voltage $V_{in}$ of the inverter 11 to be maintained at a level of $V_{DD}$. When the gate voltage $V_g$ has its logic level changed to "1" and the MOS FET 41 is rendered conductive, then the electric energy stored in the capacitor $C_3$ is discharged through the conduction path of the MOS FET 41. As the result, the input voltage $V_{in}$ falls to the ground potential as shown in FIG. 12. Where, in this case, the input voltage $V_{in}$ exceeds the threshold voltage $V_{THL}$ of the Schmitt trigger circuit section, then the inverters 11, 12 and 14 are put into operation and an output voltage signal $V_{out}$ from the Schmitt trigger circuit section sharply rises, as described in connection with the Schmitt trigger circuit of FIG. 3.

Thereafter, when the gate voltage $V_g$ has its logic level changed to "0" and the MOS FET 41 is rendered nonconductive, then the capacitor $C_3$ is charged up to the source voltage $V_{DD}$. Where the voltage caused by electric energy charged in the capacitor $C_3$ rises above the threshold voltage $V_{THH}$ of the Schmitt trigger circuit section, then the inverters 11, 12 and 13 are put into operation, causing an output voltage $V_{out}$ sharply to fall.

Thus, an output voltage signal having such waveform as shown in FIG. 13 is produced relative to the gate voltage signal $V_g$ indicated in FIG. 11. The monostable multivibrator of FIG. 10 enables the pulse width of the output voltage signal to be properly controlled by setting the resistor $R_3$ and capacitor $C_3$ to have a suitable value.

Figure 14:
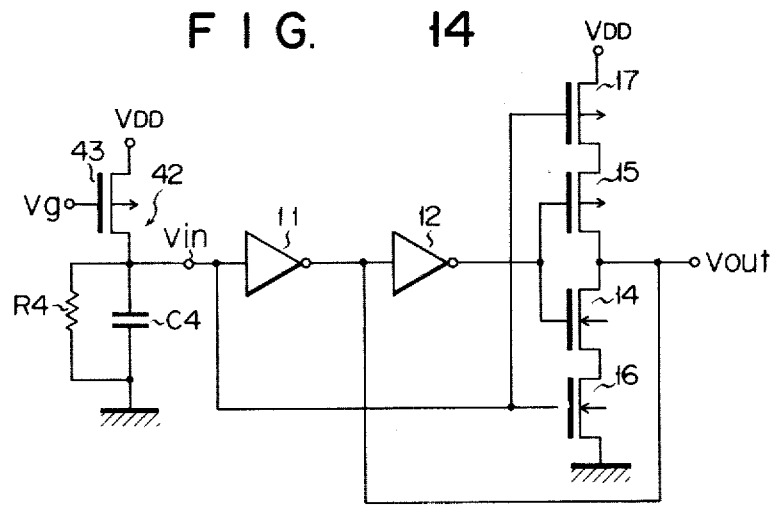
FIG. 14 is a modification of the monostable multivibrator of FIG. 10.

FIG. 14 shows a modification of the monostable multivibrator of FIG. 10. The monostable multivibrator of FIG. 14 has substantially the same arrangement as that of FIG. 10, except for an input circuit section 42 replacing the input circuit section 40 of FIG. 10. The input circuit 42 includes a parallel connected resistor $R_4$ and capacitor $C_4$ jointly constituting a CR time constant circuit and a P-channel MOS FET element 43 connected between the parallel circuit of the resistor $R_4$ and capacitor $C_4$ and the power supply terminal $V_{DD}$. The gate of the MOS FET 43 is externally supplied with a gate signal $V_g$. The monostable multivibrator of FIG. 14 is operated in the same manner as that of FIG. 10 and produces an output voltage signal having such a waveform as shown in FIG. 13.

FIG. 15 presents the arrangement of a monostable multivibrator according to a further embodiment of this invention, which is constructed by connecting an input circuit section 40 of the same arrangement as that of the monostable multivibrator of FIG. 10 to the input terminal of the Schmitt trigger circuit of FIG. 4. The monostable multivibrator of FIG. 15 is operated theoretically in the same manner as that of FIG. 10. Since the threshold voltage $V_{THH}$ and $V_{THL}$ of the Schmitt trigger circuit section can be made to vary with the logic level of the control signal $V_x$, the width of output pulses from the monostable multivibrator of FIG. 15 can be changed according to the logic level of the control signal.

There have been described the preferred embodiments of this invention. However, the invention is not limited thereto. For example, an odd number of series-connected inverters may be used with the Schmitt trigger circuit of FIGS. 3 and 4 in place of a single inverter 12. Further, the control circuit 21 of the Schmitt trigger circuit of FIG. 4 may be replaced by an inverter which supplies an inverted input signal $V_{in}$ to the inverter 12. Moreover, the MOS FETs 22 and 23 can be omitted from the Schmitt trigger circuit of FIG. 4. With the Schmitt trigger circuit of FIGS. 3 and 4, an output signal may be drawn out from the inverter 12 instead of from the inverter 13.

What we claim is:

1. An astable multivibrator comprising first and second power supply terminals; a first inverter; a second inverter whose input terminal is connected to the output terminal of the first inverter; a third inverter including an inverter section which is formed of a MOS circuit and has input and output terminals respectively connected to the output and input terminals of said second inverter and MOS elements which are connected to both terminals of the conduction path of said MOS circuit between said first and second power supply terminals and whose gates are jointly connected to the input terminal of said first inverter; a time constant circuit for supplying a signal to the input of the first inverter; and switching means for actuating the time constant circuit in response to an output signal from the second inverter and permitting a signal having a prescribed frequency to be produced from the time constant circuit to the first inverter.

2. The astable multivibrator according to claim 1, wherein the inverter section of said third inverter comprises a first MOS FET of a first conductivity type and a second MOS FET of a second conductivity type whose conduction paths are connected in series, said MOS elements include a third MOS FET of first conductivity type connected between the MOS FET and first power supply terminal and a fourth MOS FET of a second conductivity type connected between the second MOS FET and second power supply terminal; and an input signal supplied to the first inverter is also supplied to the gates of the third and fourth MOS FETs.

3. The astable multivibrator according to claim 2, wherein said MOS elements further include a fifth MOS FET connected in parallel with the third MOS FET and a sixth MOS FET connected in series with the second and fourth MOS FETs; and the gates of said fifth and sixth MOS FETs are connected together to receive a control signal.

4. The astable multivibrator according to claim 3, wherein the first inverter is formed of a seventh MOS FET of a first conductivity type and an eighth MOS FET of a second conductivity type whose conduction paths are connected in series.

5. The astable multivibrator according to claim 4, wherein the first inverter further comprises a ninth MOS FET connected in parallel with the seventh MOS FET and a tenth MOS FET connected in series with the eighth MOS FET; and the gates of the ninth and tenth MOS FETs are connected together to receive a control signal.

6. The astable multivibrator according to claim 2, wherein the first inverter is formed of a fifth MOS FET of a first conductivity type and a sixth MOS FET of a second conductivity type, the conduction paths of said fifth and sixth MOS FETs being connected in series.

7. The astable multivibrator according to claim 6, wherein the first inverter further comprises a seventh MOS FET connected in parallel with the fifth MOS FET and an eighth MOS FET connected in series with the sixth MOS FET; and wherein the gates of the seventh and eighth MOS FET are connected together to receive a control signal.

8. The astable multivibrator according to claim 1, wherein the time constant circuit is formed of a resistor and capacitor connected in parallel; and the switching means is formed of a MOS FET whose conduction path is connected between the parallel circuit of the resistor and capacitor on one hand and the first power supply terminal on the other, and whose gate is connected to the output terminal of the second inverter.

9. The astable multivibrator according to claim 1, wherein the time constant circuit is formed of a resistor and capacitor connected in series; and the switching means is formed of an MOS FET whose conduction path is connected in parallel with the capacitor and whose gate is connected to the output terminal of the second inverter.

10. The astable multivibrator according to claim 1, wherein the first inverter is formed of a first MOS FET of a first conductivity type and a second MOS FET of a second conductivity type, the first and second MOS FETs' conduction paths being connected in series.

11. The astable multivibrator according to claim 10, wherein the first inverter further comprises a third MOS FET connected in parallel with the first MOS FET and a fourth MOS FET connected in series with the second MOS FET; and wherein the gates of the third and fourth MOS FETs are connected together to receive a control signal.

* * * * *